(12) United States Patent
Kirchner et al.

(10) Patent No.: US 8,303,291 B2
(45) Date of Patent: Nov. 6, 2012

(54) IMPRINT TEMPLATE, NANOIMPRINT DEVICE AND NANOSTRUCTURING METHOD

(75) Inventors: Robert Kirchner, Dresden (DE); Matthias Ploetner, Dresden (DE); Wolf-Joachim Fischer, Dresden (DE)

(73) Assignee: Technische Universitaet Dresden, Dresden (DE)

( * ) Notice: Subject to any disclaimer, the term of this patent is extended or adjusted under 35 U.S.C. 154(b) by 48 days.

(21) Appl. No.: 12/941,545

(22) Filed: Nov. 8, 2010

(65) Prior Publication Data

US 2011/0115130 A1 May 19, 2011

(30) Foreign Application Priority Data

Nov. 6, 2009 (DE) .......................... 10 2009 053 194

(51) Int. Cl.
*B28B 17/00* (2006.01)
(52) U.S. Cl. ............... 425/174.4; 425/385; 264/494; 264/496; 264/293
(58) Field of Classification Search .................. 264/494, 264/496, 293; 425/174.4, 385
See application file for complete search history.

(56) References Cited

U.S. PATENT DOCUMENTS

| | | | | |
|---|---|---|---|---|
| 7,374,417 B2 * | 5/2008 | Kuwabara et al. | ............. | 425/385 |
| 7,473,088 B2 * | 1/2009 | Ho et al. | .................... | 425/174.4 |
| 7,677,877 B2 * | 3/2010 | Wuister et al. | ............. | 425/174.4 |
| 7,690,912 B2 * | 4/2010 | Tokita et al. | ............... | 425/436 R |
| 2003/0138704 A1 * | 7/2003 | Mei et al. | .......................... | 430/5 |
| 2006/0157444 A1 * | 7/2006 | Nakamura et al. | ............... | 216/54 |
| 2007/0023976 A1 * | 2/2007 | Kolesnychenko | ............. | 264/496 |
| 2007/0138699 A1 * | 6/2007 | Wuister et al. | ................ | 264/319 |
| 2010/0104682 A1 * | 4/2010 | Ando et al. | ................. | 425/174.4 |
| 2011/0115130 A1 * | 5/2011 | Kirchner et al. | .............. | 264/446 |

FOREIGN PATENT DOCUMENTS

DE  20 2006 008 399 U1   8/2006

OTHER PUBLICATIONS

H.S, Lee, et al., UV nano embossing for polymer nano structures with non-transparent mold insert, Mircosyst. Technol. 13, 2007, S. 593-599.
L.J. Guo, Recent progress in nanoimprint technology and its applications, J. Phys, D: Appl. Phys., 37, 2004, R123-R141—Topical Review.
L. J. Guo, Nanoimprint Lithography: Methods and Material Requirements, Adv. Mater., 19, 2007, 495-513—Review.

* cited by examiner

*Primary Examiner* — Yogendra Gupta
*Assistant Examiner* — Amjad Abraham
(74) *Attorney, Agent, or Firm* — Heslin Rothenberg Farley & Mesiti P.C.

(57) ABSTRACT

Imprint templates for use in nanoimprint lithography methods, a nanoimprint device suitable for UV nanoimprint lithography methods and a nanostructuring method for direct structuring of a UV-sensitive imprint material on a substrate are provided. The imprint templates, nanoimprint device and nanostructuring method can be used both for ultraviolet nanoimprint lithography and for thermal nanoimprint lithography. The imprint template includes a nontransparent structured chip and a transparent substrate. An at least partially nontransparent imprint template as well as a UV source situated above the imprint template holder are used for structuring by indirect exposure by reflection of light emitted from the UV radiation source in the direction of a photoactive layer.

12 Claims, 1 Drawing Sheet

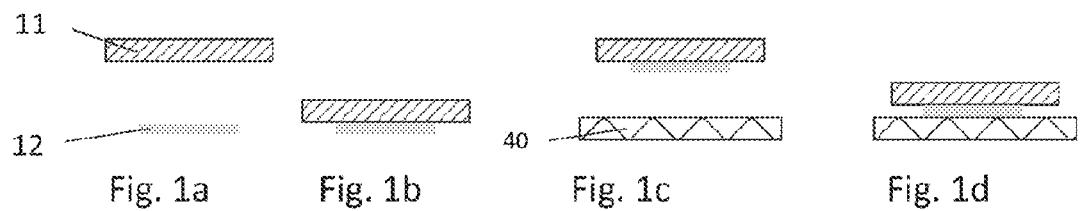
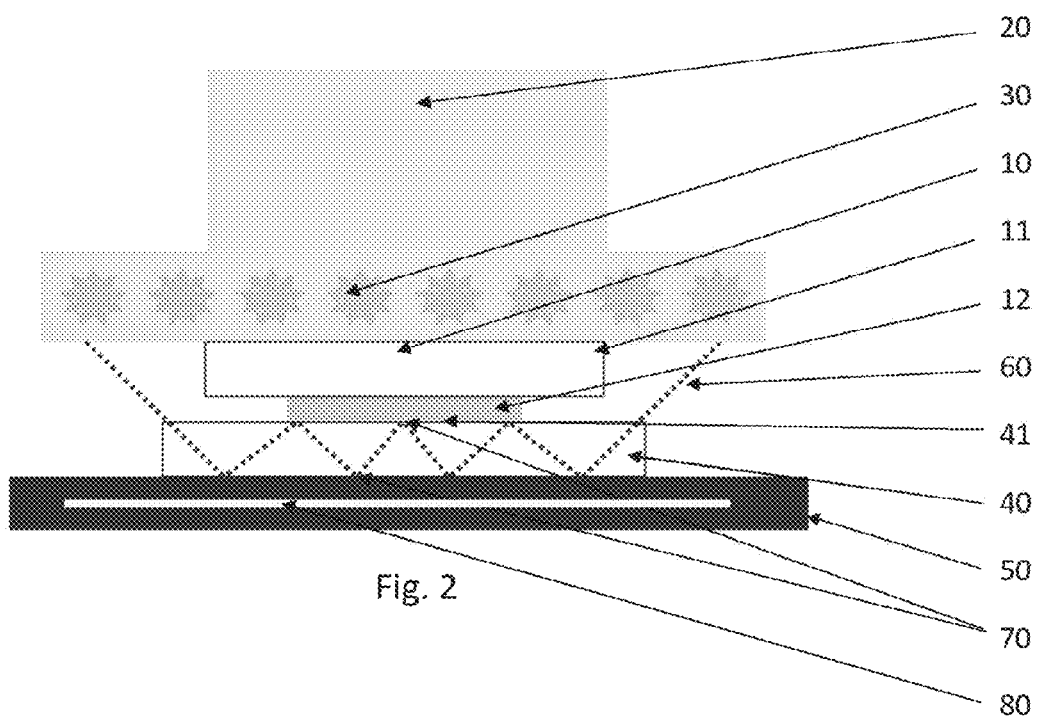
Fig. 2

IMPRINT TEMPLATE, NANOIMPRINT DEVICE AND NANOSTRUCTURING METHOD

CROSS REFERENCE TO RELATED APPLICATIONS

This application claims priority of German application No. 10 2009 053 194.7 filed on Nov. 6, 2009, the entire disclosure of which is hereby incorporated herein by reference.

BACKGROUND ART

The invention concerns imprint templates for use in nanoimprint lithography methods, a nanoimprint device suitable for UV nanoimprint lithography methods and a nanostructuring method for direct structuring of a UV-sensitive imprint material on a substrate.

Nanoimprint lithography methods are mechanical direct structuring methods in which an embossing die, also called an embossing punch, imprint mask or hereinafter imprint template, having relief on its surface, is forced with its relief into a material being structured, the so-called imprint material, in order to deform and structure it in this way. As a result, the relief is imaged one to one as a negative in the imprint material.

One then distinguishes essentially nanostructuring methods that use high temperatures and pressures in order to deform thermoplastic materials, so-called thermal nanoimprint lithography or T-NIL, from methods that use ultraviolet light (UV light) in order to cure UV-curing polymers in contact with the embossing die and to form the die structure, so-called UV nanoimprint lithography or UV-NIL. Different combinations of the two mentioned Methods are also possible.

Since nanoimprint lithography methods are structuring methods in which the desired nanostructures can be generated directly with high precision at comparatively low cost, they are an excellent alternative for appropriate applications to traditional photo and electron lithography techniques that are more expensive by orders of magnitude, in which the secondary effects of diffraction and scattering of the particles used there for exposure and therefore structuring must also be minimized in very demanding fashion.

In previous nanoimprint devices either fully nontransparent imprint templates have been used for T-NIL (typically silicon templates) or fully transparent imprint templates for UV-NIL (typically quartz templates). The transparent UV-NIL templates can also be used in principle for T-NIL.

For nontransparent T-NIL templates structure, nontransparent silicon chips that contain the negative of the structures that are to be imprinted on the imprint material situated on the substrate are ordinarily fastened to nontransparent substrates.

For transparent UV-NIL templates two essential variants are found in the prior art: use of monolithic imprint templates or use of combined imprint templates consisting of a completely unstructured, transparent substrate to which a transparent chip is fastened.

Monolithic transparent imprint templates, which generally have a format of 65 mm×65 mm×6.35 mm (W×L×H), contain a protruding structure block, the so-called mesa in the center of the template. This mesa rises several micrometers, usually up to 50 μm over the remaining template surface. The dimensions (or lengths) of the side edges of the mesa are generally smaller than the 65 mm lengths of the corresponding side edges of the entire template; the usual side edge lengths of the mesa generally being less than 25 mm. The useful structure that functions as imprint structure is situated on the mesa. Structuring of the mesa can occur by standard methods of semiconductor technology, generally by anisotropic wet or dry etching methods after photolithographic generation of a corresponding etching mask. However, mechanical methods, like milling, are also possible structuring methods of the mesa. The structure on this mesa corresponds to the negative of the structure that is to be imprinted on the imprint material situated on the substrate.

In a combined transparent imprint template, on the other hand, a completely unstructured transparent substrate is involved whose dimensions are ordinarily 65 mm×65 mm×6.35 mm and a transparent chip fastened to it, which is usually less than 1 mm thick, generally consists of quartz and is generally fastened to the unstructured transparent substrate. Here again the structure on the chip corresponds to the negative of the structure that is to be imprinted in the imprint material situated on the substrate.

According to the prior art, nanoimprint devices are constructed so that the substrate with the layer to be structured situated on it, which is also referred to as imprint material, lies on a support, the so-called chuck, which is mechanically and thermally stable and can consist, for example, of silicon carbide. A holder is situated above this substrate, but still not in contact with it before performance of the nanoimprint lithography method, which can be preferably manipulated in the x-, y- and z-direction, which contains the imprint template whose structured part points toward the layer of the substrate being structured.

Ordinarily in the UV-NIL technique, the UV radiation source for exposure of the UV-sensitive imprint material is directly integrated in the holder. The holder for this UV-NIL technique is transparent, like the imprint template and is exposed through the entire imprint template.

The requirement for transparency of the imprint template together with the requirements for chemical and mechanical properties of an imprint template like high hardness and chemical stability, however, leads to a very restricted selection of materials for transparent imprint templates. The most used material here is quartz. Although the manufacturing technique for quartz imprint templates can be referred to as advanced in comparison with other possible materials, structuring of quartz represents a greater challenge and is mastered in the structure size required here only by a few specialized suppliers. The development of corresponding competence for quartz structures is very time-consuming and cost-intensive and is therefore generally not effective for users of nanoimprint lithography methods. Both the monolithic transparent UV-NIL templates and the structured quartz chips used for combined transparent UV-NIL templates, which are then fastened to substrates, must therefore be acquired cost-intensively from the specialized suppliers.

Additional problems in using such completely transparent imprint templates occur, if one intends to use these imprint template also for thermal nanoimprint lithography methods or for a combination of both methods:

Because of the increased hazard of damage during thermal nanoimprint lithography methods it is all the more so important here to be able to produce cost-effective imprint templates. The now employed transparent imprint templates also have thermal expansion coefficients that generally deviate sharply from the thermal expansion coefficients of the now employed substrates, like silicon, on which the structure is to be imprinted. Large differences in thermal expansion coefficients of the imprint template and substrate rule out use of these templates in thermal nanoimprint lithography methods or combined UV and thermal nanoimprint lithography methods for very demanding applications with high resolution.

In order to be able to utilize the advantages of nontransparent imprint templates for UV-NIL a further possibility of UV-NIL is therefore described, in which the nontransparent imprint templates are used: For this purpose, however, the transparent substrate is exposed from below. This means that the UV source must be situated beneath or in the chuck and both this chuck and the substrate must necessarily be transparent. Such an arrangement, however, entails some problems: The chuck should simultaneously offer possibilities for heating or cooling but a UV source situated in it would only make this feasible with considerable difficulty and cost.

DE 20 2006 008 399 U1 also describes a variant for production of an at least partially transparent imprint template in which the imprint structure of the imprint template is initially structured in a preoxidation state in order to be able to use simple and well mastered structuring methods for this purpose and the structuring is then fully or partially oxidized in order to make this imprint template transparent if UV nanoimprint lithography is to be used. In the preoxidation state, if a silicon-containing imprint template is involved, not pure silicon is at issue, but a nonstoichiometric $SiO_x$ compound with on average $1<x<2$. During use of other materials nonstoichiometric compounds are also used, which must then be structured accordingly and whose final quality depends on the corresponding preoxidation state and final treatment by oxidation.

BRIEF SUMMARY OF THE INVENTION

The task of the present invention is therefore to develop cost-effective and simple imprint templates, as well as a corresponding nanoimprint device and nanostructuring method, which is usable both for ultraviolet nanoimprint lithography and for thermal nanoimprint lithography. For this purpose an already existing nanoimprint device is to be used without essential modifications.

The invention initially pertains to a new imprint template for use in nanostructuring methods, i.e., methods that are generally used for direct structuring of an imprint material on a substrate by means of this imprint template. This imprint template consists of an unstructured substrate and a structured chip fastened to it. A chip should then be understood in the broader sense to mean a generally completely structured partial element or structured element. The substrate ordinarily has edge lengths of 65 mm×65 mm×6.35 mm, whereas the chip fastened to it is less than 1 mm thick and has side edge lengths that are generally much smaller but at most precisely as long as those of the unstructured substrate. In contrast to the prior art, according to which either the unstructured substrate and the structured chip are not transparent or both are transparent, the imprint template according to the invention is formed by a transparent unstructured substrate on which a nontransparent structured chip is fastened. The unstructured substrate, for which a large number of materials can be used because of its simple producibility, therefore offers transparency for UV radiation and itself causes no obstacle for its use in UV nanoimprint lithography methods. On the other hand, a nontransparent material can be chosen for the structured chip fastened to it and the imprint template so produced nevertheless used for UV nanoimprint lithography in addition to thermal nanolithography and much simpler and more cost-effective structuring methods can be resorted to than would be the case among possible transparent materials for this structured chip. In particular, an enormous cost and manufacturing jump can be achieved, if silicon can be used as base material for the chip being structured, which is fastened to the transparent unstructured substrate of the imprint template, since the silicon structuring methods known from the semiconductor industry can be used for this purpose so that silicon can be referred to as an ideal material for production of the structured chip of the imprint template. In addition the use of nanoporous, anodized aluminum or teflon or other polymer materials is made possible as material for the structured chip of the imprint template because of such a structure (nontransparent structured chip on transparent substrate).

A transparent substrate suitable for this purpose can consist of quartz, glass or other transparent oxide materials that meet both the existing requirements for mechanical, chemical and thermal stability and whose use has long been common for UV-radiation transparent material for different other applications, among other things, as lens material or as photomask substrate in photolithography. The fact that quartz or glass can only be structured with considerable difficulty is insignificant when the material is merely used for the unstructured substrate of the imprint template.

One possibility of fastening the nontransparent structured chip on the transparent unstructured substrate is bonding of the chip and substrate by gluing. This is known method to produce imprint templates consisting of two parts, but according to the prior art transparent materials were fastened to other transparent materials or nontransparent materials were fastened on nontransparent materials by means of gluing. This type of bonding by gluing is now transferred to bonding of a nontransparent structured chip on a transparent substrate in simple fashion. In addition to joining by gluing, however, in the materials usable here for the nontransparent structure chip and for the transparent substrate new joining methods are possible, like anodic bonding or other direct bonding methods for joining of a structured silicon chip and a glass substrate. These new joining methods have advantages over the known gluing: The glues used during gluing are generally not chemically stable enough to withstand the necessary chemical cleaning of the imprint template. Additional demanding passivation letters are required in order to protect the adhesives from chemical attack during cleaning Anodically bonded joints, on the other hand, are chemically much more stable and more durable than glued joints.

The imprint templates so produced are usable in principle both for thermal nanoimprint lithography and for UV nanoimprint lithography: For thermal imprint lithography the structured silicon chip, i.e., the part of the imprint template that guarantees structuring of this imprint material in direct contact with the imprint material is the material ordinarily used already according to the prior art.

For UV nanoimprint lithography such use is possible, if it occurs with the aid of a nanoimprint device according to the invention, which because of its special features makes it possible for indirect exposure of the photoactive imprint material while the imprint material itself is shaded from the UV source by the structured chip of the imprint template. This is possible in an arrangement that contains a chuck to accommodate a substrate with a layer of imprint material situated on it, a holder to accommodate an imprint template, which can be positioned by adjusting the holder over the substrate, and a UV radiation source situated above the imprint template, in which at least the part of the imprint template containing the structures to be imaged is nontransparent and the device offers possibilities because of the arrangement of its components for indirect exposure by reflection of the light emitted by the UV radiation source in the direction of the photoactive layer.

It is advantageous if the imprint template used in this device is an imprint template according to the invention consisting of a transparent substrate on which a nontransparent structure chip is fastened, since such an imprint template reduces shading of the photoactive imprint material from the UV radiation source to the necessary minimum size of the nontransparent structure chip situated on the substrate.

In a favorable variant the substrate situated on the chuck is at least partially transparent so that it contains a transparent layer several hundred nanometers thick situated directly beneath the imprint material. In a particularly favorable embodiment this transparent layer is thicker than 500 nm. The interface of this transparent layer to the layer of substrate situated beneath it is then made strongly reflecting or an additional highly reflecting and homogenizing layer is arranged between the transparent and nontransparent layer of the substrate. This permits entry of the light emitted from the UV radiation source into this transparent layer situated beneath the imprint material, its multiple partial reflection on the interfaces and/or, depending on the employed transparent material, its simultaneous scattering, as well as its ultimate entry thereafter into the photoactive layer to produce the desired reaction and therefore solidification of the imprint material layer. In another advantageous variant a completely transparent substrate is used, during whose use it is again favorable if the interface of the transparent substrate to the chuck situated beneath it is configured strongly reflecting. In this way a situation is achieved in which the largest possible fraction of UV light is deflected from the UV source situated in the imprint template holder above the imprint template in the direction of the imprint material being exposed. In order to intensify the reflection effect it is also possible to apply an additional highly reflecting and also homogenizing layer by corresponding multiple reflections on the back of the transparent substrate or on the top of the employed chuck.

Since in many cases it is not a question of using the imprinted structure as an etching mask for the substrate, but instead using the substrate as substrate for mechanical stabilization of the imprinted structure, the use of transparent polymers, like PMMA, polystyrene or polycarbonate as substrate material is also possible in addition to the use of quartz and glass.

By accommodating the UV source in the imprint template-holder of the device according to the invention it is possible to accommodate a heating element in the chuck for controlled thermal treatment of the substrate. This provides significant processing advantages, since both thermal nanoimprint lithography and UV nanoimprint lithography as well as a combination of both methods for structuring of the imprint material is possible in alternation in the same device. In addition, commercial available nanoimprint devices can be used for this purpose without significant retrofitting.

For more effective utilization of UV radiation of the radiation source situated in the imprint template holder for indirect exposure of the photoactive imprint material it is advantageous if the light that leaves the UV radiation source is not collimated.

This arrangement can now be used to perform the following nanostructuring method according to the invention for structuring of a UV-sensitive imprint material on a substrate:

Initially a negative structure of the structure to be imprinted in the imprint material is generated on a nontransparent chip. Conventional production technologies can be used for this purpose: Since silicon chips are preferably used for this purpose, known silicon structuring processes from silicon semiconductor technology and the machines required for this can be cost-effectively used here. Consequently, a cost- and time-intensive new development of a imprint template structuring method is not necessary.

By fastening the structured nontransparent chip to a (transparent or nontransparent) substrate, the actual imprint template is then prepared. At this point both the use of already known techniques, like gluing, for joining of the substrate and structured chip is possible, and the use of new methods, like anodic bonding with which a structured silicon chip can be fastened to a transparent quartz or glass substrate.

The imprint template so produced is then adjusted in the imprint template holder of an ordinary device for nanoimprint lithography by means of UV-NIL, positioned via the chuck with the releasably fastened substrate on which the imprint material is situated, in which the substrate contains a transparent layer at least directly beneath the imprint material or is completely transparent and therefore offers the possibility of transporting UV radiation directly beneath the photoactive imprint material via the transparent layer or the completely transparent substrate.

The imprint template is then brought into contact with the imprint material of the substrate and the structure situated on the nontransparent chip of the imprint template is then imprinted in the imprint material by pressure application on the imprint template which is pressed against the substrate in so doing.

In this pressed state the imprinted structure is finally solidified with UV light through indirect exposure of the imprint material explained below, which is initially held only by the imprint template in the desired structure so that the imprint template can then be released again from the substrate and its imprint material and the structure is retained in the imprint material.

In a preferred variant the indirect UV exposure and therefore curing of the UV-sensitive imprint material is achieved by the fact that a UV radiation source, which is situated in the holder of the nontransparent imprint template and emits non-collimated light of a suitable wavelength and of an average angle of incidence optimized with reference to the arrangement of the imprint template, substrate and radiation source, is switched on for curing of the substrate. Average angle of incidence in this case should be defined as the angle of incidence calculated from the average of all angles of incidence. By using noncollimated radiation a wide area of the interior of the nanoimprint device is exposed to this undirected light. This permits the use of different reflection possibilities as well as scattering in order to be able to introduce the light through the imprint template into this imprint material, despite shading of the imprint material. This light initially also enters the transparent layer of the substrate (or the transparent substrate), is repeatedly reflected partially at the interfaces of the transparent layer of the substrate to the nontransparent layer or to the support of the substrate and the transparent layer to the imprint material and contributes to curing of this material on entering the transparent layer of the substrate in the photoactive imprint material.

In order to further extend the functionality of the method just described, in a further preferred variant it is additionally possible to carry out heat treatment of the substrate consecutively or also simultaneously. For example, this permits curing to be carried out by UV exposure at a defined temperature and therefore a consistently stable reproducible result to be obtained, introduction of a subsequent tempering step or performance of an additional step connected to UV nanoimprint lithography in the same device by means of thermal nanoimprint lithography.

Independently of the use of nanoimprint lithography, with a method that uses indirect exposure as described here, a layer to be exposed, which emits the noncollimated light from this radiation source is shaded by a nontransparent object, is then indirectly exposed and structured, if a transparent layer is arranged directly beneath the layer being exposed, which reflects the employed light strongly at its interface to its substrate and partially reflects it repeatedly at its interface to the light-sensitive layer, then finally emits fractions into the layer being exposed and therefore initiates a reaction in this light-sensitive layer that leads to its curing.

The invention is further explained below by means of figures and practical examples.

BRIEF DESCRIPTION OF DRAWING FIGURES

FIG. 1 schematically depicts the most important components of a nanoimprint device as well as the sequence of its arrangement:

FIG. 1a: unstructured transparent substrate and structured nontransparent chip of an imprint template according to the invention FIG. 1b: imprint template assembled from transparent substrate and nontransparent structured chip FIG. 1c: imprint template according to the invention positioned above the substrate FIG. 1d: imprint template according to the invention in the imprinted state on the substrate FIG. 2: nanoprint device in a schematic view

DETAILED DESCRIPTION

In a first practical example of the imprint template 10 according to the invention a silicon chip 12 structured by means of processes of silicon semiconductor technology, which contains the negative of the structure, which is to be imprinted in the imprint material situated on substrate 40, is used. The structure of nontransparent silicon chip 12, which is less than 1 mm thick and whose edge lengths are 25 mm×25 mm, is then fastened to a nonstructured transparent substrate 11 made of a glass with a size of 65 mm×65 mm×6.35 mm by anodic bonding (see FIG. 1a-1d).

The imprint template obtained on this account is part of the nontransparent imprint templates, since a imprint material situated beneath the silicon chip 12 containing the imprint structure cannot be exposed to the imprint template. However, it hampers propagation of UV radiation only in the relatively small area of structured chip 12. This facilitates the task of finding ways by means of indirect exposure to introduce the UV radiation into the imprint material 41. The fact that the imprint template 10 so produced can also be used for thermal nanoimprint lithography goes without saying, since the use of structured silicon for imprint templates 10 is common for this method.

In addition, a practical example for the device according to the invention for nanoimprint lithography methods is now described (see FIG. 2), which makes is possible to carry out both UV nanoimprint lithography and thermal nanoimprint lithography with nontransparent imprint templates 10. In order to keep the development expense as low as possible and to be able to use a commercial nanoimprint device as basis, a UV radiation source 30 is situated for this purpose in the imprint template holder 20 above the imprint template 10. The UV radiation source 30 emits noncollimated light. In order to be able to use this arrangement of UV radiation source 30, nontransparent imprint template 10 and substrate 40 shaded from imprint template 10, which is situated on the chuck 50 and can be adjustable relative to the imprint template 10, for UV nanoimprint lithography, use is made of indirect exposure of the photoactive imprint material 41 on substrate 40 in this nanoimprint device. The imprint template 10 described in the first practical example is preferably used here as imprint template 10, which consists of a nonstructured transparent substrate 11 made of glass with a size of 65 mm×65 mm×6.35 mm and a structured nontransparent silicon chip 12 with a size of 25 mm×25 mm×1 mm fastened to it by anodic bonding.

Because of slight shading of the imprint material 41 of substrate 40 only by the structured silicon chip 12 of imprint template 10, but not by the substrate 11 of imprint template 10 indirect exposure of the imprint material 41 is facilitated. In order to actually introduce the UV radiation into the photosensitive imprint material 41, a transparent substrate 40 is used in this practical example, which consists of quartz and is situated on a chuck 50, configured so that it strongly reflects UV radiation. A photosensitive imprint material 41 is applied to this substrate 40 in the area covered by imprint template 10. Indirect exposure of the imprint material 41 is therefore produced by the fact that the noncollimated UV light of an optimized average angle of incidence reaches the substrate 40 through the transparent substrate 11 of the nontransparent imprint template 10 in addition to the imprint template 10, is repeatedly reflected partially in it for the UV light transparent substrate 40 then also reaches beneath the imprint material 41 and this is exposed by the fraction of the UV light transmitted through it, which therefore penetrated the imprint material 41. In the chuck 50 of the nanoimprint device described here there is a heating element 80 which makes is possible to operate the nanoimprint lithography method according to defined exposure and temperature conditions and to conduct UV nanoimprint lithography and thermal nanoimprint lithography in the same installation in two consecutive steps.

A practical example of the planned nanostructuring method will now be given:

A silicon chip 12 is structured with known processes of silicon semiconductor technology by applying a photoresist, exposure of the photoresist using the photomask in a photolithographic scanner, development of the exposed photoresist, transfer of the structures of the developed photoresist to the silicon chip 12 by dry chemical etching, removal of the resist residues and final cleaning. The silicon chip 12 so structured contains the negative of the structure that is to be imprinted in the imprint material 41 situated on substrate 40.

By fastening the structured silicon chip 12 to a glass substrate 11 by anodic bonding the actual imprint template 10 is then prepared.

This glass/silicon imprint template 10 is adjusted in the imprint template holder 20 of a standard device for UV nanoimprint lithography. The imprint template 10 is then positioned together with the imprint template holder 20 above a quartz substrate 40, which is situated on a reflecting and heatable chuck 50. The amount of photoactive imprint material 41 required in order to fill up the structures contained in the silicon chip 12 of the imprint template 10 and therefore form a positive pattern of the negative structure of the silicon chip 12 is applied to the quartz substrate 40. The imprint template 10 is then brought into contact with the imprint material 41 and the structure situated on the silicon chip 12 of the imprint template 10 is imprinted in the imprint material 41 by application of pressure to imprint template 10. In the pressed state the UV radiation source 30 is then switched on and the imprint material solidified by the already described indirect exposure by noncollimated light which penetrates directly through the transparent substrate 40 or through the substrate 11 of the imprint template 10 in which it is partially reflected repeatedly and reaches beneath and in the imprint material 41. In this step the heating element 80 situated in chuck 50 is switched on in alternation in order to set the substrate 40 at a defined temperature and to conduct the solidification step under defined thermal conditions. The imprint template 10 is then released from the substrate 40 that contains the structure imprinted in imprint material 41, in which the structure is retained.

The invention claimed is:

1. Nanoimprint device for UV nanoimprint lithography methods, comprising: a chuck accommodating a substrate with a layer of photoactive material situated on the substrate, a holder accommodating an imprint template, the template being positioned by adjusting the holder above the substrate, and a UV radiation source situated above the imprint template, wherein the template comprises an unstructured substrate and a structured chip fastened to the unstructured substrate, the structured chip containing a negative imprint structure and having side edges of lengths smaller or as long as corresponding side edges of the unstructured substrate, the structured chip consisting of a material nontransparent to ultraviolet light and the unstructured substrate comprising a material transparent to ultraviolet light, the photoactive material layer of the substrate to be imprinted is shaded from direct exposure to the UV radiation source by the nontransparent material of the structured chip, and all components are arranged to facilitate reflection of ultraviolet light emitted from the UV radiation source to an underside of the shaded photoactive material layer.

2. Nanoimprint device according to claim 1, wherein the structured chip comprises a silicon ship or nanoporous, anodized aluminum or a polymer material and/or the unstructured substrate comprises quartz, glass or other transparent oxide materials.

3. Nanoimprint device according to claim 1, wherein the structured chip is fastened to the unstructured substrate by a glue joint or by a direct bonding method.

4. Nanoimprint device according to claim 1, in combination with apparatus implementing UV nanoimprint lithography and thermal nanoimprint lithography, independently and in combination.

5. Nanoimprint device according to claim 1, wherein the substrate is situated on the chuck and is partially transparent so that the substrate contains an ultraviolet light transparent layer several hundred nanometers thick, the transparent layer is situated directly beneath the imprint material and an interface of the transparent layer to a non-transparent layer of the substrate situated beneath the transparent layer is highly reflecting of ultraviolet light and/or the transparent layer is strongly scattering of ultraviolet light and/or an additionally highly reflecting and homogenizing layer is arranged between the transparent layer and the nontransparent layer of the substrate.

6. Nanoimprint device according to claim 1, wherein the substrate is situated on the chuck and is fully ultraviolet light transparent and an interface of the transparent substrate to the chuck situated beneath the substrate is highly reflecting of ultraviolet light.

7. Nanoimprint device according to claim 6, wherein the fully transparent substrate comprises one of glass, quartz or a transparent polymer.

8. Nanoimprint device according to claim 6, wherein a back of the substrate and/or the chuck contain an additional highly reflecting and homogenizing layer and/or structure.

9. Nanoimprint device according to claim 1, wherein the chuck contains a heating element for controlled thermal treatment of the substrate.

10. Nanoimprint device according to claim 1, wherein light leaving the UV radiation source is noncollimated and has an average angle of incidence to the substrate optimized for directing light entry onto the underside of the shaded photoactive material layer situated on the substrate.

11. Imprint template according to claim 2, wherein the polymer material comprises Teflon.

12. Nanoimprint device according to claim 7, wherein the transparent polymer comprises PMMA, polystyrene or polycarbonate.

* * * * *